United States Patent
Howard et al.

[11] Patent Number: 5,928,725
[45] Date of Patent: Jul. 27, 1999

[54] METHOD AND APPARATUS FOR GAS PHASE COATING COMPLEX INTERNAL SURFACES OF HOLLOW ARTICLES

[75] Inventors: Peter Howard, West Haverstraw; Michael Williams, Upper Nyack; Suebali Rahemanji, Pomona; Scott Lucas, New Hempstead; Chong Yi, New City, all of N.Y.

[73] Assignee: Chromalloy Gas Turbine Corporation, N.Y.

[21] Appl. No.: 08/896,579

[22] Filed: Jul. 18, 1997

[51] Int. Cl.$^6$ ...................................................... B05D 7/22
[52] U.S. Cl. .......................... 427/237; 427/239; 427/250; 427/255
[58] Field of Search ..................... 427/237, 250, 427/239, 255; 118/715

[56] References Cited

U.S. PATENT DOCUMENTS

| | | |
|---|---|---|
| 2,886,469 | 5/1959 | Fitzer . |
| 3,079,276 | 2/1963 | Puyear et al. . |
| 3,335,028 | 8/1967 | Zupan . |
| 3,486,927 | 12/1969 | Gaujé . |
| 3,694,255 | 9/1972 | Brill-Edwards . |
| 3,764,373 | 10/1973 | Speirs et al. . |
| 4,132,816 | 1/1979 | Benden et al. ............................ 427/237 |
| 4,148,275 | 4/1979 | Benden et al. ........................... 118/49.5 |
| 4,292,871 | 10/1981 | Hieber et al. ............................. 427/237 |
| 4,347,267 | 8/1982 | Baldi ........................................ 427/237 |
| 4,501,776 | 2/1985 | Shankar ................................... 427/253 |
| 4,687,684 | 8/1987 | Restall et al. ........................... 427/248.1 |
| 5,068,127 | 11/1991 | Fournes et al. .......................... 427/237 |
| 5,071,678 | 12/1991 | Grybowski et al. ..................... 427/253 |
| 5,215,785 | 6/1993 | Strasser et al. .......................... 427/230 |
| 5,217,757 | 6/1993 | Olson et al. ............................. 427/253 |
| 5,221,354 | 6/1993 | Rigney ..................................... 118/725 |
| 5,264,245 | 11/1993 | Punola et al. ............................ 427/237 |
| 5,462,013 | 10/1995 | Punola et al. ............................ 118/719 |
| 5,591,007 | 1/1997 | Lee et al. .................................. 416/97 |

*Primary Examiner*—Janyce Bell
*Attorney, Agent, or Firm*—Mitchell D. Bittman

[57] ABSTRACT

A method and apparatus is provided to coat the internal surfaces of a hollow article having gas flow passages by supplying a coating gas to the passages with the coating gas flow rate to at least two of the passages controlled to a different rate to deposit a coating of desired thickness on the internal surfaces of each passage.

21 Claims, 7 Drawing Sheets

METHOD AND APPARATUS FOR GAS PHASE COATING COMPLEX INTERNAL SURFACES OF HOLLOW ARTICLES

BACKGROUND OF THE INVENTION

This invention relates to a method and apparatus for gas phase coating of complex internal surfaces of a hollow article, and, more particularly, gas phase deposition of metallic coatings, such as aluminum coatings, on the internal surfaces of a turbine engine component having at least two gas flow passages.

The aluminizing process is well-known in the art. The process is used to apply an aluminide coating to substrates, such as nickel-base superalloy articles. Some of these articles require a coating on internal surfaces. For some articles, such as turbine airfoils, the internal surfaces are complex and accessible only through narrow, restricted passageways. To cool these turbine airfoils, manufacturers are designing the internal surfaces to provide multiple gas passages.

Advanced turbine engines have resulted in the need for improved methods for coating the turbine airfoils. The internal surfaces of advanced turbine hardware are now subjected to such elevated temperatures that uncoated portions of such hardware are oxidized in service. As the oxide scale is formed in these narrow, serpentine passageways, a thickened scale grows from the surface, resulting in a narrowing of the passageway, which in turn reduces the effectiveness of the cooling air. The result is that the degradation process proceeds at an ever-increasing rate. This accelerated oxidation process can be stopped only by effectively coating the entire interior passageway of the part.

Several methods currently exist for coating the interior surfaces of articles, such as turbine airfoils. Each has limitations which may add significantly to the cost and time required to process the articles, or which may result in a failure to adequately coat the internal surfaces, particularly complex internal surfaces having multiple gas passages.

One of the methods currently used to coat articles is a pack diffusion process. In this process, the surfaces of the articles to be coated are embedded in a source of finely divided particles including an aluminum source, a volatile halide to act as a chemical transfer medium for the aluminum, and a ceramic phase, such as alumina powder, to prevent the agglomeration of the metallic components, and heated to an elevated temperature, usually at least 1200° F., all within a retort. Among the problems encountered is the accumulation of powdered particles in the narrow passages or openings of the parts prevents the flow of the aluminum gas through the narrow serpentine passageways. The result is a lack of a coating in the blocked passageways. Even in openings which are not blocked, it has been observed that the coating thickness tends to be thicker at or near the opening, and decreases rapidly with increasing distance from the opening. This nonuniform coating frequently results in unacceptable airfoils.

Another method used to coat articles is referred to as an over the pack process, such as described in Benden, U.S. Pat. No. 4,132,816 dated Jan. 2, 1979. This process is a simple modification of the pack process, in that the parts to be processed are suspended over the powdered material rather than embedded in the powdered material. In order to deposit the gaseous aluminum, produced by the elevated temperature decomposition of aluminum in the presence of the halide activator, onto the suspended parts, an inert gas is introduced into the retort and passed over the surfaces to be coated. This process is an improvement over pack processes since no powder mixture is in contact with the surfaces, and hence cannot block the openings to the narrow passageways. Although an improvement for coating internal passageways as compared to pack processing, the only control over the deposition rate as the reaction proceeds is control over the argon gas pressure, the chemistry of the powdered mixture, flow and modification of the reaction temperature and time at temperature. However, such a system lacks control over the coating of the internal passageways.

A modification of this method is described in Benden, U.S. Pat. No. 4,148,275 dated Apr. 10, 1979, in which the retort has two chambers for effecting simultaneous coating for the exterior and the interior portions of the article. Each chamber has separate powder mixtures. The improvement allows better control of the coating of the internal passageways by controlling the flow rate of the carrier gas into the chamber which contains the aluminum source, the inert filler and the metal halide. This control is in addition to control available through variations in temperature and time.

Another method of applying a coating to articles having narrow, serpentine passageways, such as turbine airfoils, is chemical vapor deposition, also referred to as CVD. In CVD, the part to be coated is placed in a retort. An aluminum-bearing gas is generated at an elevated temperature in a reaction chamber outside of the retort, typically by reacting an aluminum source with an activator gas, such as a halide. The aluminum halide gas is then transported from the reaction chamber to the retort by a carrier gas (eg. $H_2$ or argon). The aluminum halide gas then reacts at the surface of the article, depositing an aluminide coating. The resultant, halide-bearing gas is exhausted from the retort. See, for example, U.S. Pat. 5,264,245.

While these gas phase coating methods are effective they do not accommodate for the complex internal surfaces containing multiple gas passages of modern airfoils resulting in a non-uniform internal coating thereof.

There therefore exists a need for improved apparatus and improved processing methods for applying, gas phase coating on complex internal surfaces.

SUMMARY OF THE INVENTION

Briefly this invention provides a method and apparatus for coating the internal surfaces of a hollow article having at least two gas flow passages by supplying a coating gas to the passages with the coating gas flow rate to at least two of the passages controlled to a different rate to deposit a uniform coating of desired thickness on the internal surfaces of each passage.

DETAILED DESCRIPTION OF THE INVENTION

In order to cool modern airfoils of gas turbine engines, these airfoils are being designed with complex internal surfaces having a plurality of gas flow paths (i.e. passages, channels, circuits or chambers) therein with differing gas flow characteristics. See, for example, U.S. Pat. No. 5,591,007 which depicts a turbine airfoil with a plurality of serpentine cooling passages or circuits. FIGS. I and II depict airfoils having multiple gas flow passages therein, with FIG. I showing a blade 1 having four gas flow passages 2–5 and FIG. II showing a blade 6 having three gas flow passages 7–9. The requirements to properly coat the internal surfaces of each passage can vary. By measuring the gas flow characteristics, the length of the passage, the number and size of cooling exit holes through each passage, the internal surface area to be coated, the volume of the passage and desired coating thickness of each passage the requirements to coat each passage is established. To meet these requirements and based on these measurements, the coating gas flow rate to each passage relative to the other is determined. These measurements are used to adjust the coating gas flow rate into each passage to have the desired volume of coating gas exit from each passage. A ratio of the gas flow rates of each internal passage modified to take into account the quantity and size of cooling exit holes in each passage can be used to determine coating gas flow requirements of each passage. In one embodiment the relative coating gas flow rate into each passage is controlled to approximately the relative gas flow rates of each gas flow passage. Even after these calculations, empirical experiments can be used to fine tune the final adjustments on coating gas flow rates into each passage to get the desired coating thickness in each passage.

Based on the coating requirements, the coating gas flow rate to at least two of the passages is separately controlled to a different rate to deliver the appropriate flow rate and volume of coating gas to each internal passage providing the appropriate coating thickness for each passage. Generally, the flow rate is adjusted so that the coating thickness of the internal surfaces of each passage is approximately the same, although it is possible to adjust the flow rate so the internal surfaces of each passage can have a different coating thickness. The means for controlling the gas flow rate can vary and can be, for example, utilizing different size (ie. orifice or diameter) tubes for supplying the coating gas into each passage from a common coating gas supply source, or a valve to control the flow rate to at least one of the passages in the article.

Figure 1:
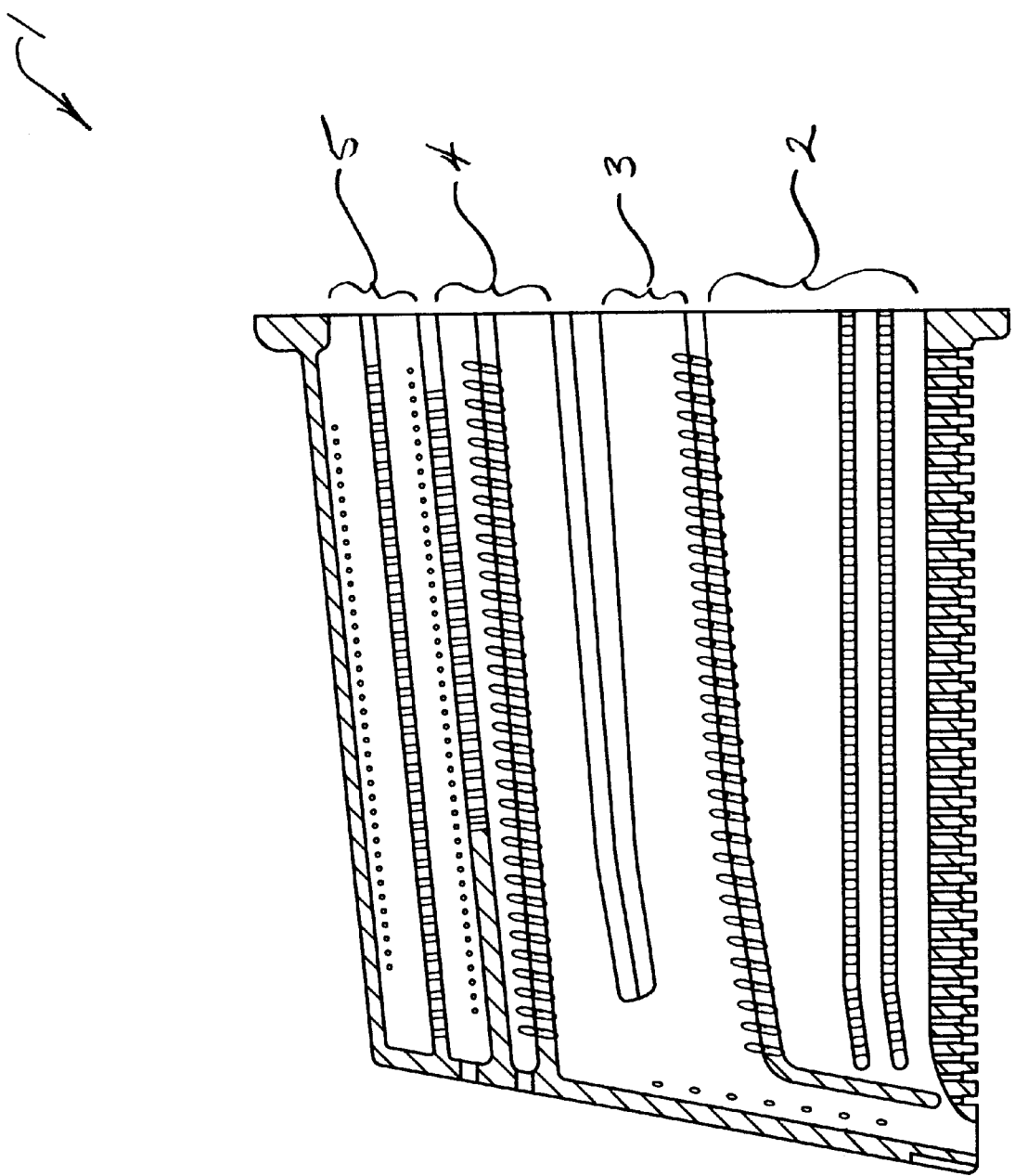
FIG. 1 is a sectional view of a Siemens V84 first blade showing four gas flow passages.
Figure 2:
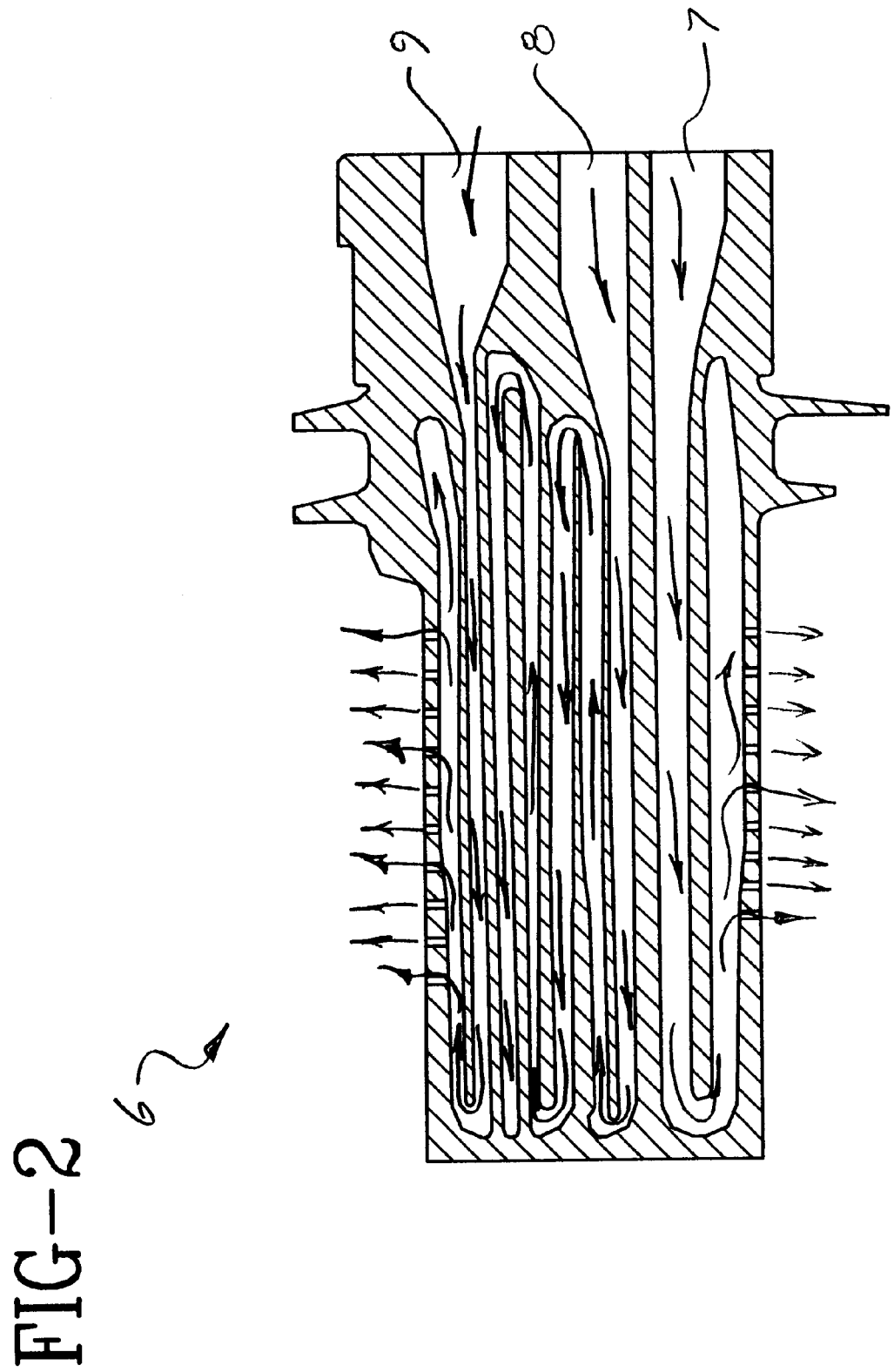
FIG. 2 is a sectional view of a GE 90 blade showing three gas flow passages.
Figure 3:
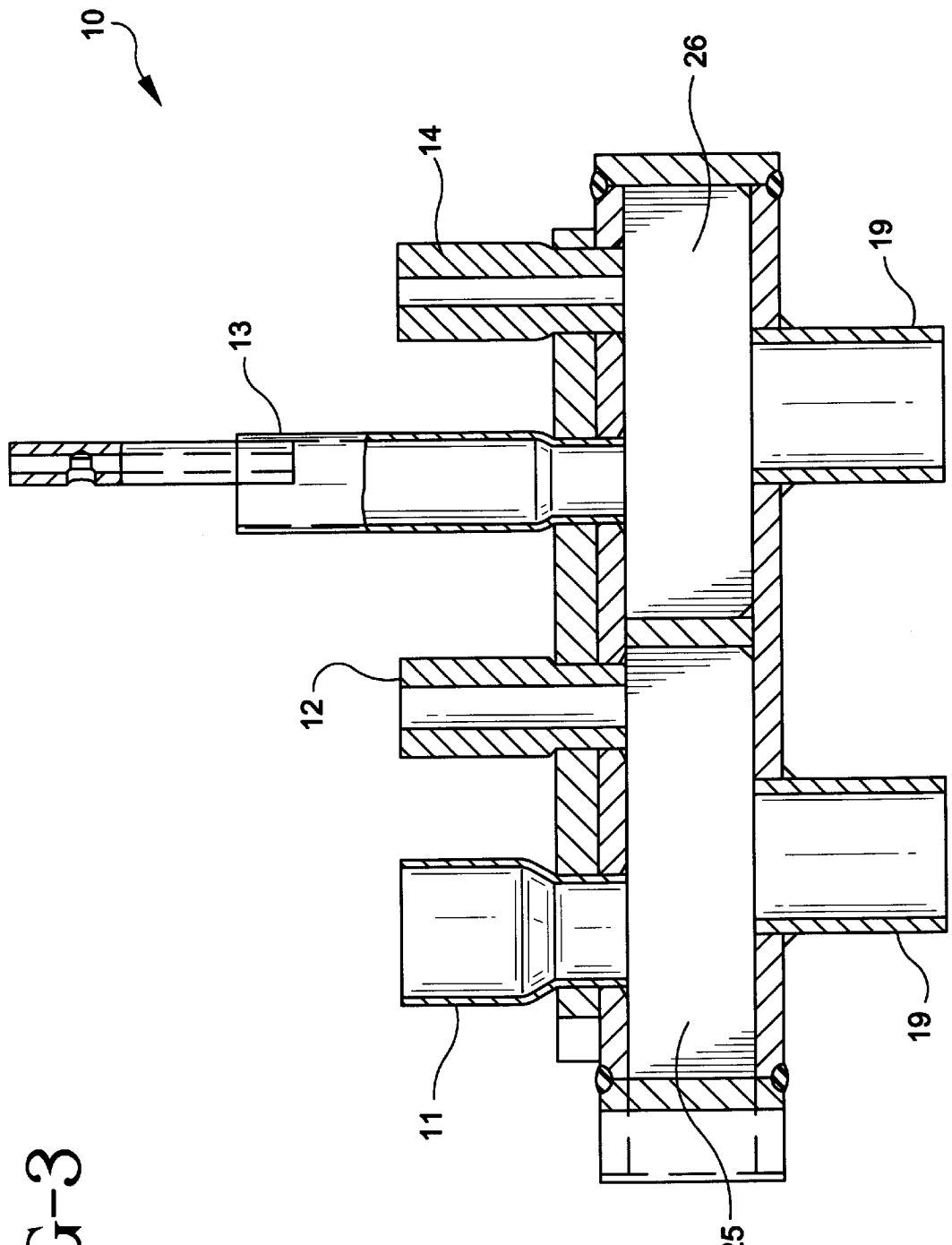
FIG. 3 is a sectional view of a manifold for supplying coating gas to each passage of the Siemens V84 first blade having supply tubes of different diameters.
Figure 4:
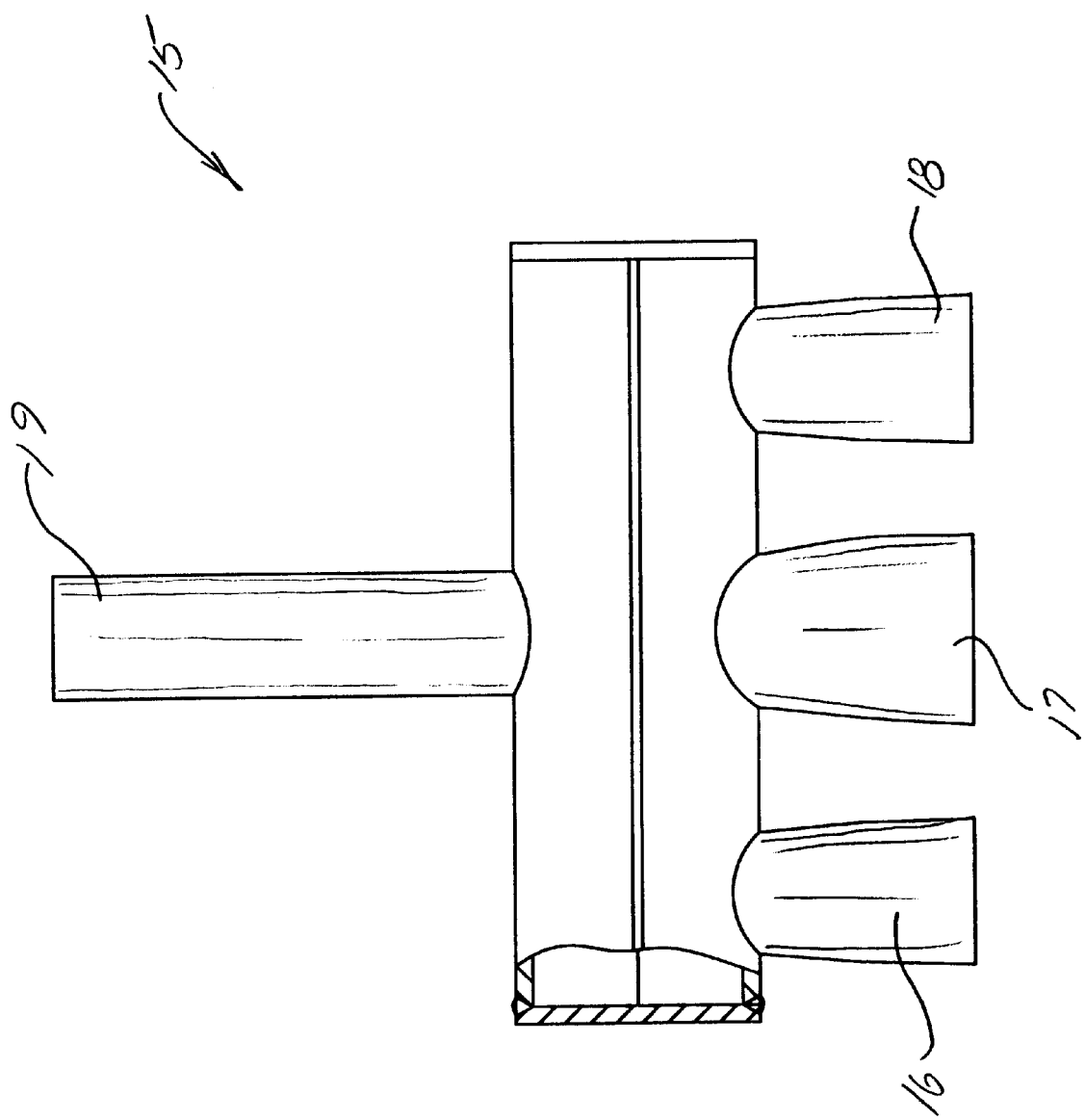
FIG. 4 is a sectional view of a manifold for supply coating gas to each passage of the GE 90 blade having supply tubes of different diameters.
Figure 5:
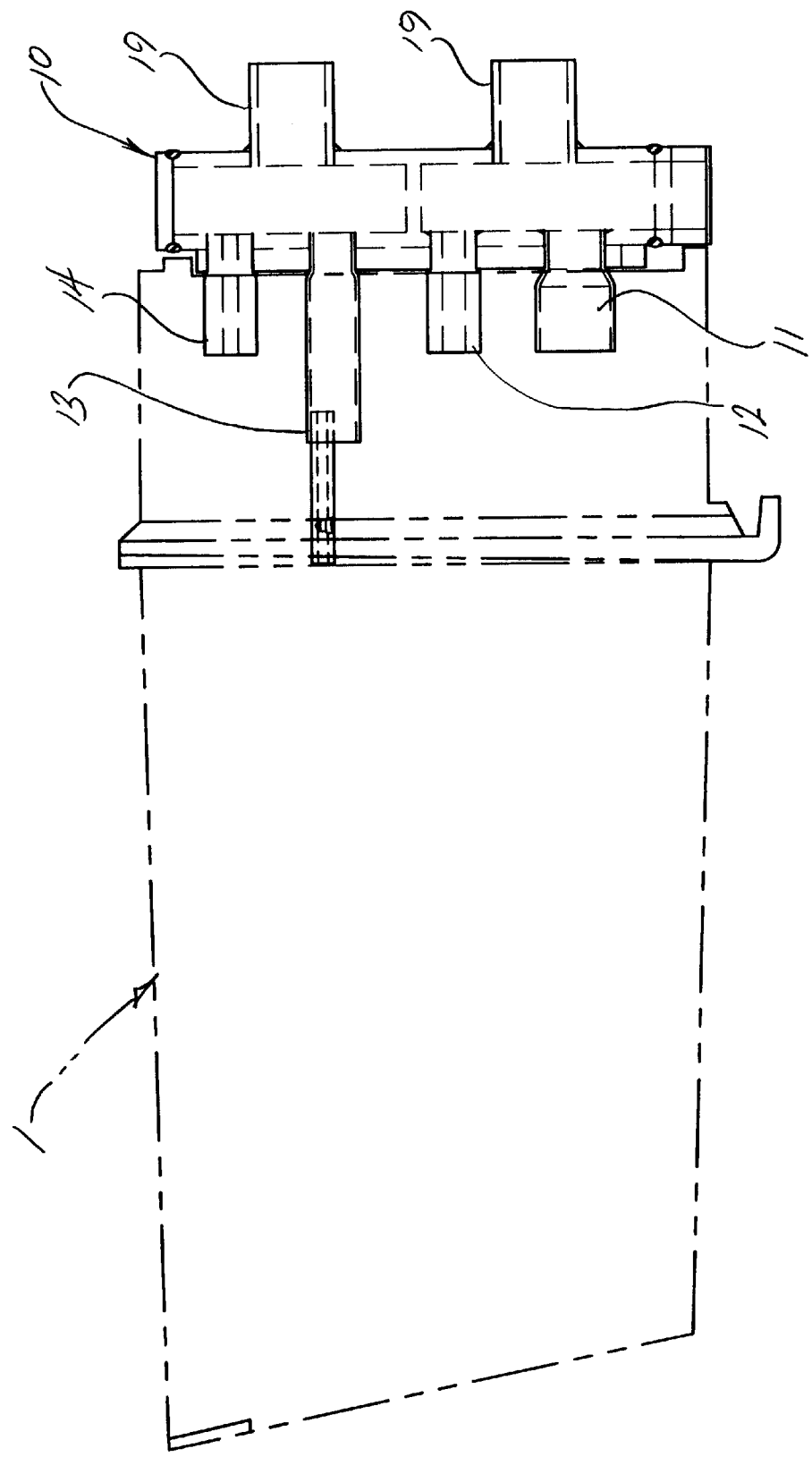
FIG. 5 is partial sectional view of the coating gas supply manifold of FIG. 3 assembled with the Siemens V84 first blade of FIG. I to supply coating gas.
Figure 6:
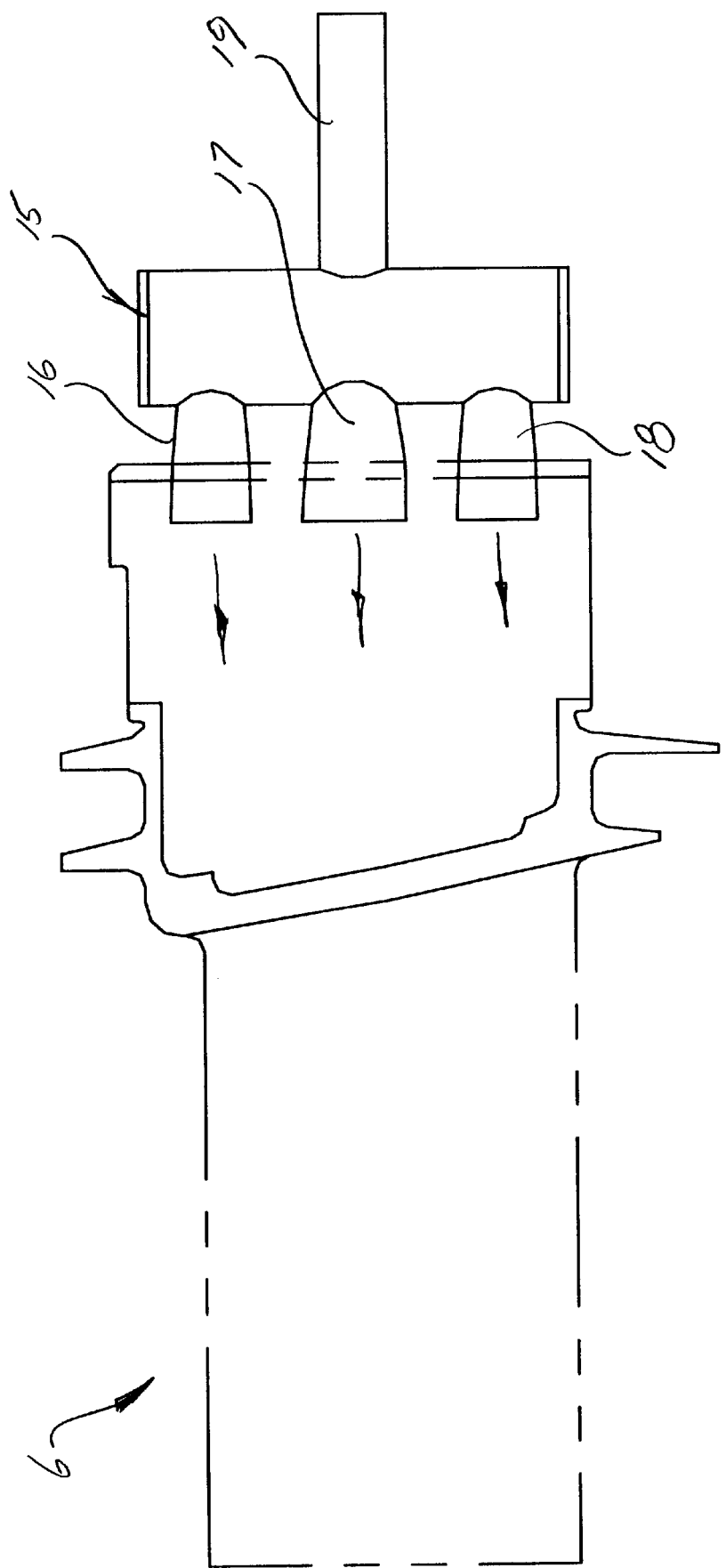
FIG. 6 is a partial sectional view of the coating gas supply manifold of FIG. 4 assembled with the GE 90 blade of FIG. II to supply coating gas.

FIG. 3 shows a supply manifold 10 provided with supply tubes 11–14 for supplying coating gas into the corresponding gas flow passages 2–5 of FIG. 1, as shown in FIG. 5. FIG. III also shows supply manifold 10 having plenums 25 and 26, with plenum 25 supplying coating gas for supply tubes 11 and 12 and plenum 26 supplying coating gas for supply tubes 13 and 14. The diameters of each of the supply tubes 11–14 are restricted to control the flow of coating gas therethrough. Likewise, FIG. 4 shows a supply manifold 15 provided with supply tubes 16–18 for supplying coating gas into the corresponding gas flow passages 7–9 of FIG. 2, as shown in FIG. 6. In each of the FIGS. 3 and 4 tube 19 is used to supply the coating gas to the supply manifold from a coating gas supply.

The coating gas can provide for the gas phase deposition of metallic coatings, such as aluminides, which are particularly useful in protecting the internal surfaces of turbine airfoils. The gaseous aluminum coating gas can be supplied by an above the pack process (as generally described in U.S. Pat. No. 4,148,275) or chemical vapor deposition process as detailed above. For example, a coating mixture including aluminum powder, aluminum oxide and aluminum fluoride ($AlF_3$ activator) is heated to approximately 1975° F. with a carrier gas of hydrogen or argon to deliver the coating gas to the part.

Figure 7:
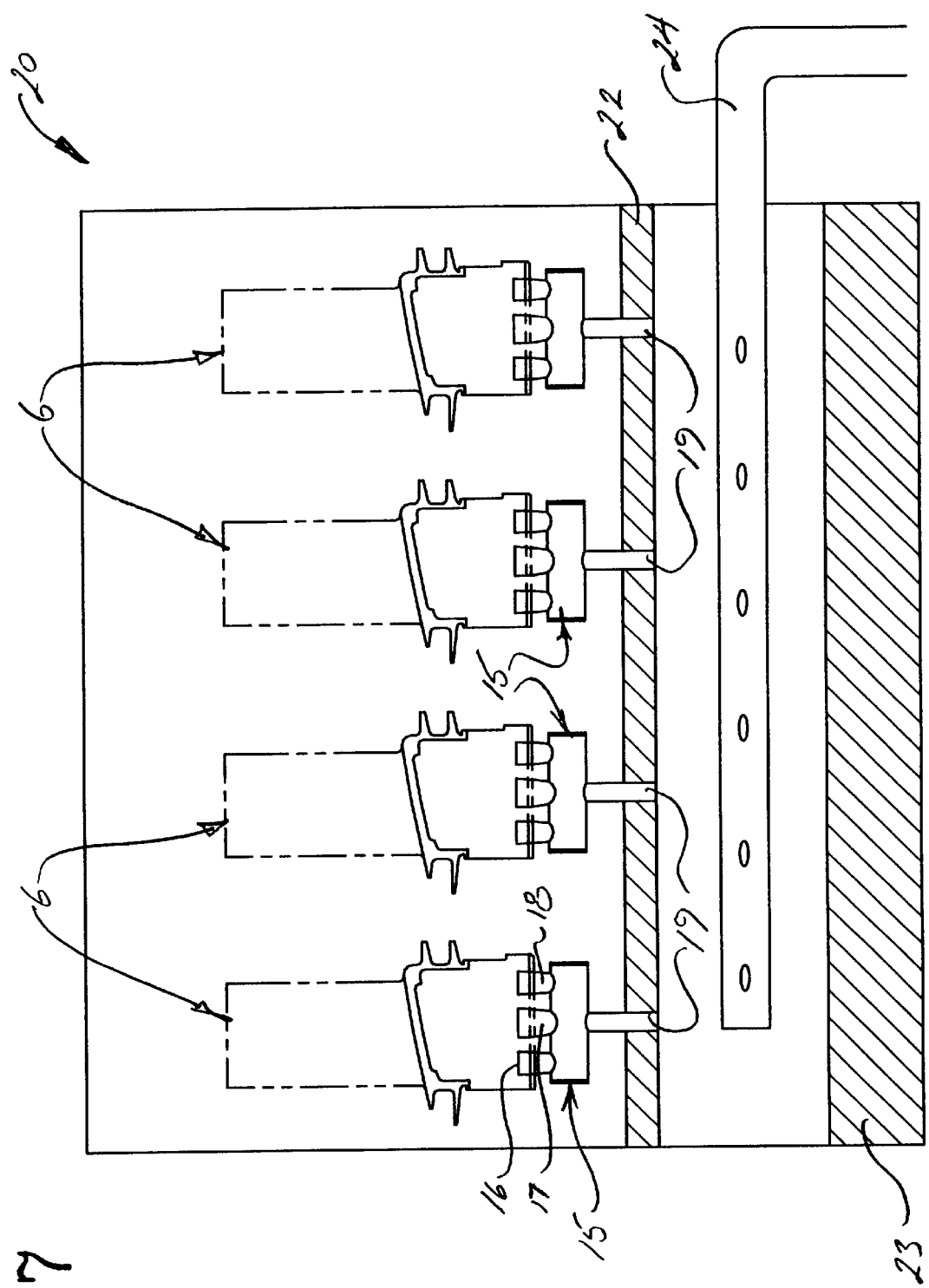
FIG. 7 is a sectional view of a coating set-up for practicing the present invention.

A coating set-up 20 is shown in FIG. 7. This set-up will coat both the external and internal surfaces of the airfoils. In this set-up the airfoil and supply manifold shown in FIG. 6 are exemplified. A gaseous metallic coating gas is generated from upper reactor bed 22 to coat the external surfaces of the blade 6 and lower reactor bed 23 to coat the internal surfaces. A carrier gas is introduced through tube 24 to carry the coating gas through tubes 19 into supply manifold 15 and through supply tubes 16–18 into the internal passages of the blade 6.

EXAMPLE 1

The Siemens V84 First Blade illustrated in FIG. I has four gas flow passages 2–5 with the following gas flow characteristics. It is noted that passages 3 and 4 are crosslinked (ie. by gas flow orifices). The coating gas supply manifold 10 shown in FIG. III utilized supply tubes 11–14 with sizes (i.e. different diameters) as per the indicated orifice areas to control the flow rate into each passage to provide the desired uniform coating thickness in each passage.

| Passage | Avg. Passage Length (in.) | Gas Flow pds/sec. | Supply Tube Orifice Area (in$^2$) | Supply Tube |
|---|---|---|---|---|
| 2 | 15 | 0.000108 | 0.077 | 11 |
| 3 | 5 | 0.000044 | 0.050 | 12 |
| 4 | 10 | 0.000044 | 0.040 | 13 |
| 5 | 5 | 0.000023 | 0.035 | 14 |

An above the pack raw materials coating mixture of 2% aluminum fluoride, 5% aluminum and 93% alumina is used to fill the lower reactor bed only in a coating set-up as illustrated in FIG. VII loaded with 20 blades to coat only the internal surfaces of the blades. Typical amounts are approximately 35 pounds of material in the lower reactor bed. A diffusor gas flow rate of 200 cubic ft. per hour is used to carry the coating gases into the parts. Approximately 10 cubic ft. per hour of argon is used as the carrier gas to deliver the coating gases into each part. A flow rate of 100 cu. ft./hour is also used as a purge gas. The assembly is heated to 1975° F.+/−25° F. and held at temperature for four hours while the coating gas flow is maintained through the parts.

A uniform aluminide coating thickness of 1.5 mils +/−1.0 mils was observed in each passage.

EXAMPLE 2

The GE 90 first stage turbine blade illustrated in FIG. II has three passages 7–9 with the following gas flow characteristics. The coating gas supply manifold 15 shown in FIG. IV utilized supply tubes with different sizes (i.e. diameters) as per the indicated orifice areas to control the flow rate into each passage to provide the desired uniform coating thickness in each passage.

| Passage | Avg. Passage Length (in.) | Gas Flow pds/sec. | Supply Tube Orifice Area (in$^2$) | Supply Tube |
|---|---|---|---|---|
| 7 | 6.7 | 0.000030 | 0.006 | 16 |
| 8 | 15.3 | 0.000179 | 0.04 | 17 |
| 9 | 6.7 | 0.000030 | 0.006 | 18 |

An above the pack raw materials coating mixture of 2% aluminum fluoride, 3% aluminum and 95% alumina is used to fill the reactor bed in a coating set up as illustrated in FIG. VII loaded with 35 blades. Typical amounts are approximately 30 pounds of material in the lower reactor bed for the internal feed. The raw materials coating mixture used to coat the external portions of the blade have a mixture of 3% aluminum trifluoride and 7% aluminum with a total mixture by weight of 40 pounds in the upper reactor bed for the external surface. A gas flow rate of 150 cubic ft. per hour is used as the carrier gas to carry the coating gases into the parts. Approximately 4.3 cubic feet per hour of argon is used as the carrier gas to deliver the coating gases into each part. A flow rate of 100 cubic feet/hour is also used as a purge gas. The assembly is heated to 1975° F. +/−25° F. and held at temperature for 5.5 hours while the coating gas flow is maintained through the parts.

A uniform aluminide coating thickness of 1.5 mils +/−1.0 mils was observed in each passage.

What is claimed:

1. A process for coating the internal surfaces of a hollow article having at least two gas flow passages comprising:

measuring the gas flow characteristics of the gas flow passages;

supplying a coating gas into the gas flow passages of the article with a coating gas flow rate to at least two of the gas flow passages separately controlled to a different rate based on the measurement of gas flow characteristics to deposit a coating of desired thickness on the internal surfaces of each of the gas flow passages, wherein the coating gas flow rate is controlled to a different rate by supplying the coating gas into each gas flow passage through supply tubes with different orifice sizes.

2. Process of claim 1 wherein at least two gas flow passages have different gas flow rates.

3. Process of claim 2 wherein the relative coating gas flow rate into each gas flow passage is controlled to approximately the relative gas flow rate of each gas flow passage.

4. Process of claim 1 wherein the coating gas flow rate is controlled to provide approximately the same thickness coating in all of the gas flow passages.

5. Process of claim 1 wherein the hollow article is an airfoil of a gas turbine engine.

6. Process of claim 5 wherein the coating gas provides an aluminide coating.

7. An apparatus for coating the internal surfaces of a hollow article having at least two gas flow passages, comprising:

a. an enclosure for generating a coating gas;

b. means for supplying the coating gas into the gas flow passages of the article;

c. means for controlling the coating gas flow rate into at least two of the gas flow passages to a different rate to deposit a coating of desired thickness on the internal surfaces of each of the gas flow passages, wherein the coating gas is provided to the article through a supply manifold having at least two separate plenums.

8. A process for coating the internal surfaces of a hollow article having at least two gas flow passages comprising:

measuring the gas flow characteristics of the gas flow passages;

supplying a coating gas into the gas flow passages of the article with a coating gas flow rate to at least two of the gas flow passages separately controlled to a different rate based on the measurements of gas flow characteristics to deposit a coating of desired thickness on the internal surface of each of the gas flow passages, wherein the coating gas flow rate is controlled to a different rate by supplying the coating gas through a valve which controls the coating gas flow rate to at least one of the gas flow passages.

9. Process of claim 8 wherein at least two gas flow passages have different gas flow rates.

10. Process of claim 9 wherein the relative coating gas flow rate into each gas flow passage is controlled to approximately the relative gas flow rate of each gas flow passage.

11. Process of claim 8 wherein the coating gas flow rate is controlled to provide approximately the same thickness coating in all of the gas flow passages.

12. Process of claim 8 wherein the hollow article is an airfoil of a gas turbine engine.

13. Process of claim 12 wherein the coating gas provides an aluminide coating.

14. A process for coating the internal surfaces of a hollow article having at least two gas flow passages comprising:

supplying a coating gas into the gas flow passages of the article with a coating gas flow rate to at least two of the gas flow passages separately controlled to a different rate to deposit a coating of desired thickness on the internal surfaces of each of the gas flow passages, wherein the coating gas is provided to the article through a supply manifold having at least two separate plenums.

15. Process of claim 14 wherein the gas flow rate is controlled to a different rate by supplying the coating gas into each gas flow passage through the manifold having a supply tube with a different orifice size.

16. Process of claim 15 wherein at least two gas flow passages have different gas flow rates.

17. Process of claim 16 wherein the relative coating gas flow rate into each gas flow passage is controlled to approximately the relative gas flow rate of each gas flow passage.

18. Process of claim 14 wherein the coating gas flow rate is controlled to provide approximately the same thickness coating in all of the gas flow passages.

19. Process of claim 14 wherein the gas flow rate is controlled to a different rate by supplying the coating gas through a valve which controls the coating gas flow rate to at least one of the gas flow passages.

20. Process of claim 14 wherein the hollow article is an airfoil of a gas turbine engine.

21. Process of claim 20 wherein the coating gas provides an aluminide coating.

* * * * *